(12) United States Patent
Raczkowski

(10) Patent No.: US 8,054,155 B2
(45) Date of Patent: Nov. 8, 2011

(54) TWO LAYER TRANSFORMER

(75) Inventor: Jakub Raczkowski, Leuven (BE)

(73) Assignees: IMEC, Leuven (BE); Katholieke Universitat Lueven, Leuven (BE)

( * ) Notice: Subject to any disclaimer, the term of this patent is extended or adjusted under 35 U.S.C. 154(b) by 0 days.

(21) Appl. No.: 12/647,798

(22) Filed: Dec. 28, 2009

(65) Prior Publication Data

US 2011/0032065 A1 Feb. 10, 2011

(30) Foreign Application Priority Data

Aug. 7, 2009 (JP) ................................. 2009-185299

(51) Int. Cl.
*H01F 5/00* (2006.01)
*H01F 27/29* (2006.01)
*H01F 27/28* (2006.01)

(52) U.S. Cl. ......... 336/200; 336/192; 336/223; 336/232

(58) Field of Classification Search ........................ None
See application file for complete search history.

(56) References Cited

U.S. PATENT DOCUMENTS

| | | | |
|---|---|---|---|
| 6,870,457 B2 | 3/2005 | Chen et al. | |
| 7,164,339 B2 * | 1/2007 | Huang | 336/200 |
| 7,482,904 B2 | 1/2009 | Lee et al. | |
| 7,570,144 B2 * | 8/2009 | Lim et al. | 336/200 |
| 2003/0071706 A1 * | 4/2003 | Christensen | 336/200 |
| 2003/0137381 A1 | 7/2003 | Toyoda et al. | |
| 2006/0077028 A1 * | 4/2006 | Huang | 336/223 |
| 2008/0174396 A1 * | 7/2008 | Choi et al. | 336/182 |
| 2009/0284339 A1 * | 11/2009 | Choi et al. | 336/200 |

FOREIGN PATENT DOCUMENTS

EP 0902443 3/1999

OTHER PUBLICATIONS

Vaesen, Kristof et al., "Area Optimized Thin Coupled Inductor Band Pass Filters with Integrated Baluns", Electronics Packaging Technology Conference, 2008, EPTC 2008, 10th, pp. 260-264, Dec. 9-12, 2008.
Mini-Circuits, How RF Transformers Work, http://www.minicircuits.com/pages/pdfs/howxfmerwork.pdf, pp. 1-9.
Raczowski et al., 50-67 GHz ESD protected power amplifiers in digital 45 nm LP CMOS, Slides presented at IEEE International Solid-State Circuits Conference, San Francisco, CA, Feb. 11, 2009.
Raczowski et al., 50-67 GHz ESD protected power amplifiers in digital 45 nm LP CMOS, Conference digest paper, IEEE International Solid-State Circuits Conference, San Francisco, CA, Feb. 11, 2009.

* cited by examiner

*Primary Examiner* — Anh Mai
*Assistant Examiner* — Mangtin Lian
(74) *Attorney, Agent, or Firm* — McDonnell Boehnen Hulbert & Berghoff LLP

(57) ABSTRACT

One aspect of the invention relates to a symmetrical transformer with a stacked coil structure comprising two coils each having at least two turns. The coils are located in two conductive planes. The structure includes four identical basic elements, each basic element providing a conductive path for part of the coils. The terminals of the transformer are located at opposite sites of the structure so that the structure can be easily connected in a chain. The invention also relates to a semiconductor device comprising such a structure.

9 Claims, 11 Drawing Sheets

B1, B2, B3, B4

TWO LAYER TRANSFORMER

CROSS-REFERENCE TO RELATED APPLICATIONS

This application claims priority under 35 U.S.C. §119 to Japanese Patent Application no. 2009-185299, filed on Aug. 7, 2009, which is hereby incorporated herein by reference in its entirety.

TECHNICAL FIELD OF THE INVENTION

The invention relates to a symmetrical transformer with a stacked coil structure comprising a primary and a secondary coil each having at least two turns, the primary and secondary coils being located in a first and a second conductive plane which are electrically isolated from each other by an intermediate dielectric layer, the primary and secondary coils being electrically isolated from each other and being arranged so that magnetic coupling takes place between them, according to the preamble of the first claim. The invention also relates to a semiconductor device comprising such a structure.

BACKGROUND OF THE INVENTION

Transformers are known in the art and they are used in different types of circuits. Miniaturization has allowed these transformers to be integrated on-chip. Such an integrated transformer is typically used at the input of an RF circuit, where it is typically used as a balun (balanced-unbalanced) to convert a single-ended signal coming from an antenna into a differential signal before entering a differential amplifier. When differential signaling is used, the corresponding coil typically has a center tap which is connected to ground, so that one terminal of the coil provides a positive signal, while the other provides a negative signal. Ideally the signals on these terminals are exactly opposite to each other over the frequency range of interest, meaning their amplitude is identical, and their phase difference is 180° over the entire frequency range. In practice of course, this is not exactly the case, but usually a structure with more geometrical symmetry also provides better electrical symmetry. An integrated transformer is typically also used at the output of an RF circuit, where it is typically used as a balun to convert a differential signal coming out of power amplifiers into a single-ended signal to be applied to the antenna. Transformers can also be used to convert a first single-ended signal into a second single-ended signal, of the same or a different voltage depending on the number of turns of the coils. Transformers can also be used in fully differential mode to connect a differential output of a first circuit to a differential input of a next circuit with galvanic separation.

At millimeter-wave frequencies, such an integrated transformer is typically implemented using two layers of one turn transformers. Unfortunately this structure has to be relatively large to obtain a certain inductance. To increase the inductance the area can be increased or the number of turns, or a combination of both. Increasing the number of turns usually means increasing the number of layers. For on-chip transformers however, especially for RF applications, the practical limit of the number of layers is usually limited to two.

Several transformer structures are proposed in the art. U.S. Pat. No. 6,870,457 describes a symmetrical stacked inductor comprising a plurality of conductive layers separated by isolating non-conductive layers, the conductors on the separate layers being interconnected using vias through the isolating layers. A disadvantage of the structures described in U.S. Pat. No. 6,870,457 is that at least three metal layers are required to create a two turn transformer.

U.S. Pat. No. 7,482,904 describes an on-chip transformer balun including a primary winding as an input terminal of the on-chip transformer balun, and a secondary winding as an output terminal of the on-chip transformer balun. A disadvantage of this structure is that the proposed structure having two times two turns cannot be implemented in two conducting layers, as each of the winding structures requires an overpass or underpass.

U.S. Patent Application Publication no. 2003/0137381 describes a transformer balun that is symmetrical in structure and can have any number of turns. A disadvantage of this structure is that a transformer having two times two coils cannot be implemented in two conducting layers, as each coil requires two layers because of the required metal bridge.

European Patent Application Publication no. 0 902 443 describes a planar coupled coil arrangement of two magnetically coupled coils, each coil having two windings, the arrangement being implemented in two conducting planes. A disadvantage of this coil structure however is that the terminals of the two coils are located at the same side of the structure, making it difficult to connect it in a chain.

SUMMARY

One aspect of the invention is a symmetrical transformer comprising a primary and a secondary coil, each having at least two turns, the primary and secondary coils being located in a first and a second conductive plane which are electrically isolated from each other by an intermediate dielectric layer, the primary and secondary coils being electrically isolated from each other and being arranged so that magnetic coupling takes place between them, wherein the structure comprises four identical basic elements, each basic element providing a conductive path for part of said coils, the first conductive plane comprising a first of said basic elements and a second of said basic elements electrically isolated from each other, the first basic element providing half of the turns and a first terminal of the first coil, the second basic element providing half of the turns and a second terminal of the second coil, the first terminal of the first coil and the second terminal of the second coil being located on opposite sides of the structure, the second conductive plane comprising a third of said basic elements and a fourth of said basic elements electrically isolated from each other, the third basic element providing half of the turns and a third terminal of the second coil, the fourth basic element providing half of the turns and a fourth terminal of the first coil, the fourth terminal of the first coil and the third terminal of the second coil being located on opposite sides of the structure, the first and fourth terminal of said first coil being located on the same side of the structure, the second and third terminal of said second coil being located on the same side of the structure, an end of the first basic element being electrically connected to an end of the fourth basic element by a first connection through the dielectric layer, an end of the second basic element being electrically connected to an end of the third basic element by a second connection through the dielectric layer.

By providing a structure comprising four identical basic elements, disposed in two conducting layers and interconnected as described above, a structure for a symmetrical transformer comprising two coils of at least two turns each, whereby the terminals of the coils are located at opposite sites of the structure, is provided.

In certain aspects of the invention, by using four identical basic elements the layout of the transformer can be simplified and a structure with more electrical and geometrical symmetry can be achieved.

In certain aspects of the invention, as each basic element provides half of the windings of a coil, and each coil comprises two basic elements connected in series, the electrical and geometrical middle point of each coil can be clearly defined.

In the structure of the invention, each coil has only one interconnection through the dielectric layer separating the two conductive planes, which can result in a coil with a larger inner area, and a structure with better electrical properties.

Moreover, in certain aspects of the invention, the geometry of the current structure can be easily adapted to increase the number of turns to any practical number, limited only by the available space.

In preferred embodiments, the structure of the present invention is geometrically symmetrical around three axes passing through the center of the structure, perpendicular to each other. A first possible axis of symmetry is perpendicular to the conducting planes. A second possible axis of symmetry is located in the dielectric layer, and passing through the first and second connections, a third possible axis of symmetry is located in the dielectric layer, and passing in the middle between the first and second connections. Having three symmetry axes through the center of the structure has the advantage that the geometrical symmetry of the structure can be highly enhanced and thus also the electrical symmetry.

In preferred embodiments, the first coil of the symmetrical transformer of the present invention includes a first center-tap located at the first connection, which enables the terminals of the first coil to be used as a differential port. The second coil of the symmetrical transformer of the present invention may also include a second center-tap located at the second connection, which enables the terminals of the second coil to be used as a differential port.

As the middle of the first and second coils are clearly defined, so is the position of the center tap of each coil. By connecting one or both center taps to a common mode voltage, the terminals of the corresponding port can be used for differential signalling.

The invention also relates to a semiconductor device comprising an integrated symmetrical transformer as described above, wherein metal planes of the device are used as conductive planes for the transformer.

As the transformer of the present invention is located in only two conducting layers, on-chip integration of the transformer can be implemented using only two metal planes. For a high quality transformer, the resistance of the conductors of the coil should be as low as possible. Metal planes are well suited for this.

In preferred embodiments, the semiconductor device is implemented in CMOS technology, and the power and/or ground planes are used as the metal planes. As the power and/or ground planes in standard CMOS technology are thicker than the other metal planes, tracks of a given width have less resistance in these thicker planes, resulting in better electrical characteristics. This holds for any technology having metal layers of different thickness.

In preferred embodiments, the semiconductor device is implemented in thin film technology, and the power and/or ground planes are used as the metal planes.

BRIEF DESCRIPTION OF THE DRAWINGS

The invention will be further elucidated by means of the following description and the appended drawings.

FIG. 4C shows the amplitude imbalance

FIG. 4D shows the phase imbalance

FIG. 4E shows the inductance of the coils of the simulation structures of FIGS. 3A and 3B.

FIG. 4F shows the mutual inductance of the coils of the simulation structures of FIGS. 3A and 3B.

FIG. 4G shows the coupling factor k of the coils of the simulation structures of FIGS. 3A and 3B.

FIG. 4H shows the insertion loss of the structure in a transformer configuration (differential signalling) of the simulation structures of FIGS. 3A and 3B.

DETAILED DESCRIPTION OF THE INVENTION

Figure 1A:
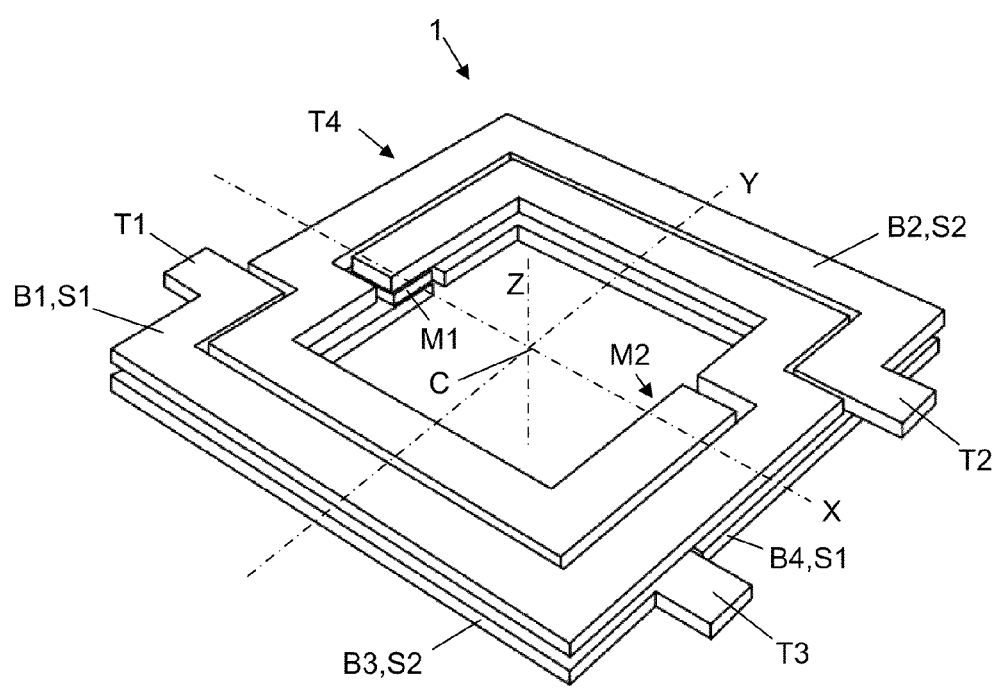
FIG. 1A is a perspective view of one embodiment of a transformer according to the present invention, having two coils of two turns each.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the invention.

Furthermore, the terms first, second, third and the like in the description and in the claims, are used for distinguishing between similar elements and not necessarily for describing a sequential or chronological order. The terms are interchangeable under appropriate circumstances and the embodiments of the invention can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the invention described herein can operate in other orientations than described or illustrated herein.

The term "comprising", used in the claims, should not be interpreted as being restricted to the elements or steps listed thereafter; it does not exclude other elements or steps. It is to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

One aspect of the invention relates to a structure 1 of an on-chip transformer which can be implemented in two conductive planes, without requiring a third layer for under- or overpass. FIG. 1A is a perspective view of one embodiment of a transformer according to the present invention, having two coils S1, S2 of two turns each. The transformer comprises a primary and secondary coil S1, S2 located in a first and a second conductive plane which are electrically isolated from each other by an intermediate dielectric layer, the primary and secondary coils S1, S2 being electrically isolated from each other and being arranged so that magnetic coupling takes place between them, wherein the structure 1 comprises four identical basic elements B1, B2, B3, B4, each basic element providing a conductive path for part of said coils S1, S2, as shown in FIG. 1B, the first conductive plane comprising a first of said basic elements B1 and a second of said basic elements B2 electrically isolated from each other, the first basic element B1 providing half of the turns and a first terminal T1 of the first coil S1, the second basic element B2 providing half of the turns and a second terminal T2 of the second coil S2, the first terminal of the first coil T1 and the second terminal of the second coil T2 being located on opposite sides of the structure 1, as shown in FIG. 1D, the second conductive plane comprising a third of said basic elements B3 and a fourth of said basic elements B4 electrically isolated from each other, the third basic element B3 providing half of the turns and a third terminal T3 of the second coil S2, the fourth basic element B4 providing half of the turns and a fourth terminal T4 of the first coil S1, the fourth terminal of the first coil T4 and the third terminal T3 of the second coil S2 being located on opposite sides of the structure 1, as shown in FIG. 1E, the first and fourth terminal T1, T4 of said first coil S1 being located on the same side of the structure 1, the second and third terminal T2, T3 of said second coil S2 being located on the same side of the structure 1, an end E1 of the first basic element B1 being electrically connected to an end E4 of the fourth basic element B4 by a first connection M1 through the dielectric layer, an end E2 of the second basic element B2 being electrically connected to an end E3 of the third basic element B3 by a second connection M2 through the dielectric layer.

The inner area surrounded by the coils and the outer area of the structure of FIG. 1A are essentially square, but the structure can easily be modified to other shapes, such as: rectangular, circular, hexagon, octagon, or any other shape known by the person skilled in the art.

An advantage of this stacked coil structure is that the terminals (T1, T4 for S1 and T2, T3 for S2) of the two coils are located at opposite sides of the structure, making it easy to connect the transformer in a chain. An example of such a chain could comprise three elements: 1) a first transformer acting as a first balun to convert an incoming single-ended antenna signal into a differential signal, 2) a signal processing circuit taking the differential signal as input, and generating a differential output signal, 3) a second transformer acting as a second balun to convert the differential output signal into a single-ended output signal for the antenna.

Figure 1B:
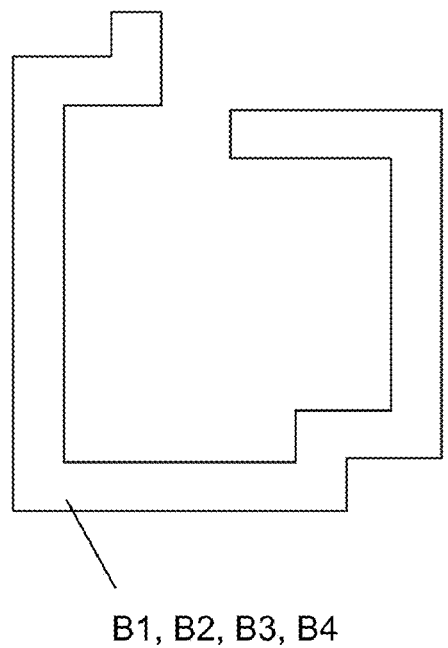
FIG. 1B shows the geometry of a basic element used in the transformer of FIG. 1A.

FIG. 1B shows the geometry of the basic elements B1, B2, B3, B4 used in the transformer structure of FIG. 1A. Each basic structure provides one terminal of the transformer structure 1.

Figure 1C:
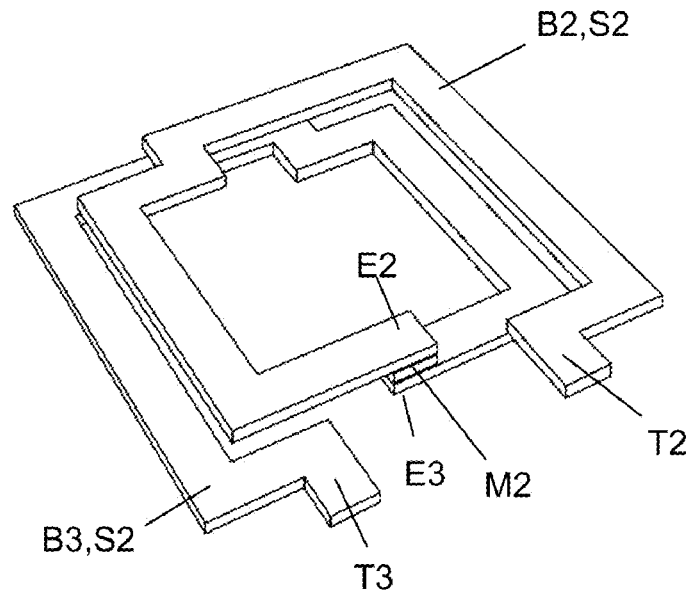
FIG. 1C shows how two basic elements of FIG. 1B can be positioned in two layers, and interconnected at their ends, to form a coil having two terminals and two turns.
Figure 1D:
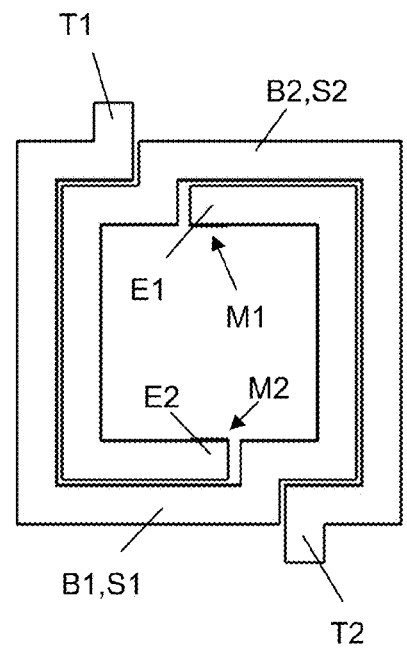
FIG. 1D shows one metal layer of the transformer of FIG. 1A. It can be seen that it comprises two basic elements, one for each coil.
Figure 1E:
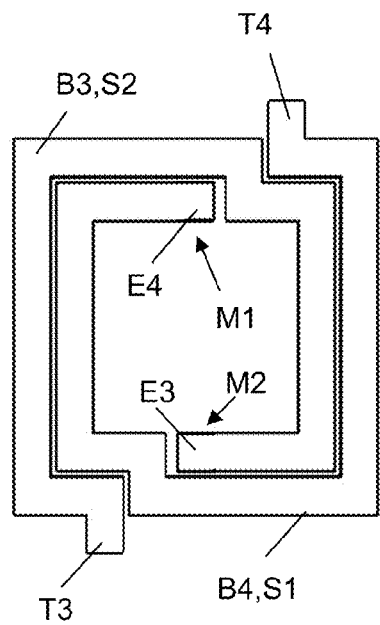
FIG. 1E shows the other metal layer of the transformer of FIG. 1A. It can be seen that it comprises the other two basic elements, one for each coil.

FIG. 1C shows how two basic elements B2, B3 of FIG. 1B can be positioned in two layers, and can be interconnected at their ends E2, E3 through the dielectric layer between the conducting layers, the interconnection being represented by M2, to form a coil S2 having two terminals T2, T3 and two turns, one in each conducting plane. The interconnection between the end points E2, E3 can for example be implemented using conductive vias through the dielectric layer. Note that there is only one interconnection location M2 needed per coil which can result in better electrical properties of the coil and/or the structure. The fact that the terminals T2, T3 are located in a different plane, does not form a problem to interconnect the structure to other circuits.

When comparing FIG. 1A and FIG. 1C, it can be seen that the structure of the transformer 1 of FIG. 1A comprises in fact two interleaved coil structures shown in FIG. 1C, but rotated 180° around a vertical axis Z.

FIGS. 1D and 1E each shows one conductive layer of the transformer of FIG. 1A, in this case FIG. 1D is used as the lower layer, and FIG. 1E as the upper layer, but the alternative is also possible. It can be seen that each conductive layer comprises two basic elements B1, B2 resp B3, B4, one for each coil S1, S2.

Figure 2A:
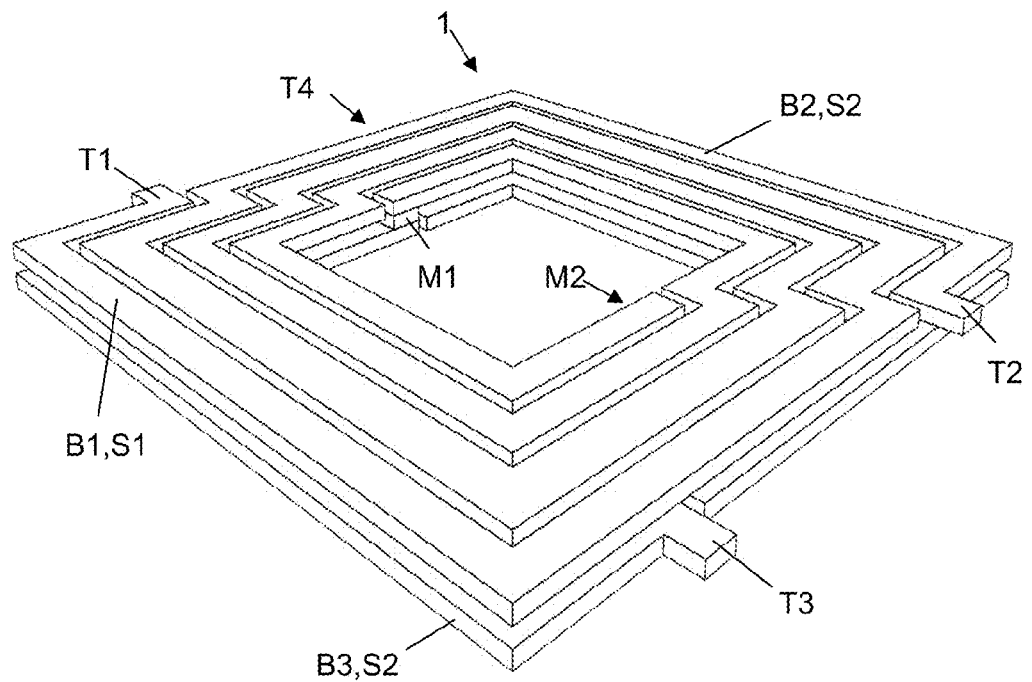
FIG. 2A is a perspective view of one embodiment of a transformer according to the present invention, having two coils of four turns each.

FIG. 2A shows a transformer structure 1 according to the invention, whereby each coil S1, S2 has 4 turns. This example shows that the geometry of the structure 1 of the invention can be easily adapted to increase the number of turns. Other numbers of turns than 2 or 4 are also possible, for example 3, 5, 6, or even higher.

Figure 2B:
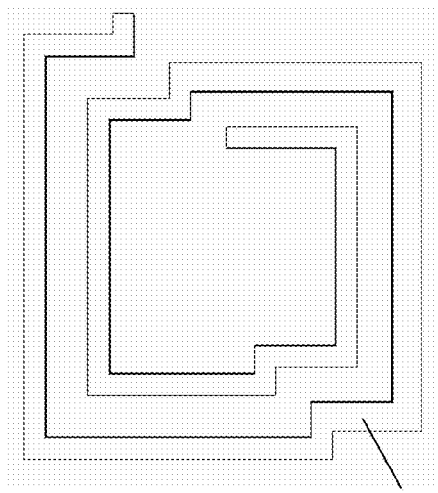
FIG. 2B shows the geometry of a basic element used in the transformer of FIG. 2A.
Figure 2C:
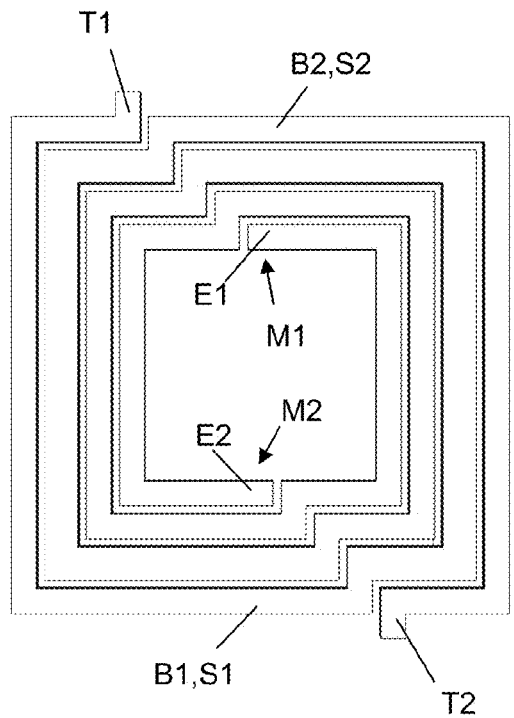
FIG. 2C shows one metal layer of the transformer of FIG. 2A. It can be seen that it comprises two basic elements, one for each coil.
Figure 2D:
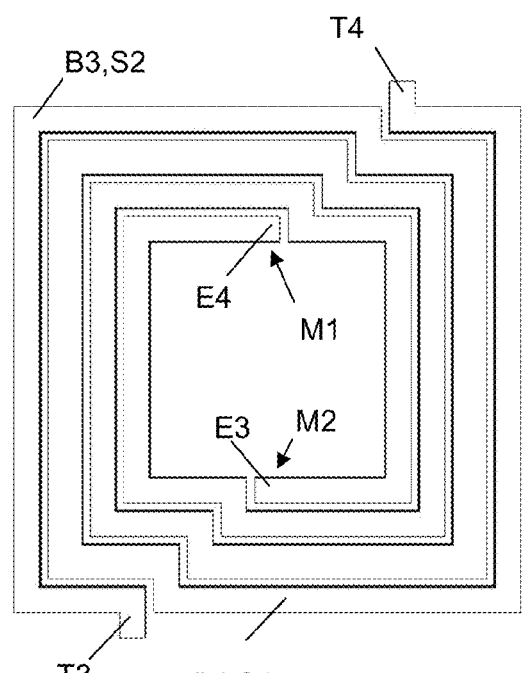
FIG. 2D shows the other metal layer of the transformer of FIG. 2A. It can be seen that it comprises the other two basic elements, one for each coil.

A practical way to generate the basic shape B1, B2, B3, B4 for a transformer structure 1 with more than 2 turns according to the invention, is to start from points T1 and T2 of FIG. 1D, and placing additional conductive paths around the structure, until the desired number of turns is reached, keeping in mind that each conductive layer provides half the number of turns. This needs to be done for both basic shapes of FIG. 1D simultaneously as the paths for both coils are interleaved to avoid cross-over or cross-under. FIGS. 2C and 2D show how the result would look like for two basic shapes B1, B2 resp B3, B4 for coils S1, S2 with 4 turns each. FIG. 2A shows the corresponding 3D perspective view to the structure 1, and FIG. 2B shows the shape of a single basic element B1, B2, B3, B4 for this structure. Since inductance increases in proportion to the square of the number of coil turns, the coils S1, S2 of this structure can have a very high Q factor.

It can be seen that the structure of FIG. 1A is geometrically symmetrical around three axes X, Y, Z passing through the center C of the structure 1, perpendicular to each other. A first possible axis Z of symmetry is perpendicular to the conducting planes. A second possible axis X of symmetry is located in the dielectric layer, and passing through the first and second connections M1, M2, a third possible axis Y of symmetry is located in the dielectric layer, and passing in the middle between the first and second connections M1, M2. FIG. 1A shows these symmetry axes, passing through the center C of the structure 1. When rotating the structure 1 over 180° over any of these symmetry axes, an identical structure is obtained. When mirroring the structure with respect to the plane YZ, XZ or XY, a structure with essentially the same electrical characteristics is obtained, but the terminals would be located in the other plane.

FIG. 1A shows that the first coil S1 of the symmetrical transformer 1 of the present invention includes a first center-tap located at the first connection M1, which enables the terminals T1, T4 of the first coil S1 to be used as a differential port. Likewise, the second coil S2 of the transformer may also include a second center-tap located at the second connection M2, which enables the terminals T2, T3 of the second coil S2 to be used as a differential port.

When the center tap of a coil is connected to a common mode voltage, for example a supply voltage of ground, the signals on the terminals can be used as differential signals, meaning one terminal providing a positive signal, the other terminal providing a negative signal. The combination of two terminals of a coil are called a port. When one port of the structure is used in differential mode, and the other in single-ended mode, the structure is called a balun (balanced-unbalanced). The structure of the invention can be used with none, one or both center taps connected to a common mode voltage, whereby the common mode voltage can be different for each center tap. In an example, both center taps are connected using vias to a ground voltage, which in a practical example could be, for example, an aluminum or copper plane situated below the transformer structure.

The invention also relates to a semiconductor device comprising an integrated symmetrical transformer as described above, wherein metal planes of the device are used as conductive planes for the transformer.

As the transformer of the present invention is located in only two conducting layers, on-chip integration of the transformer can be implemented using only two metal planes. For a high quality transformer, the resistance of the conductors of the coil should be as low as possible. Having a high conductivity, metal planes are well suited for this.

Figure 5:
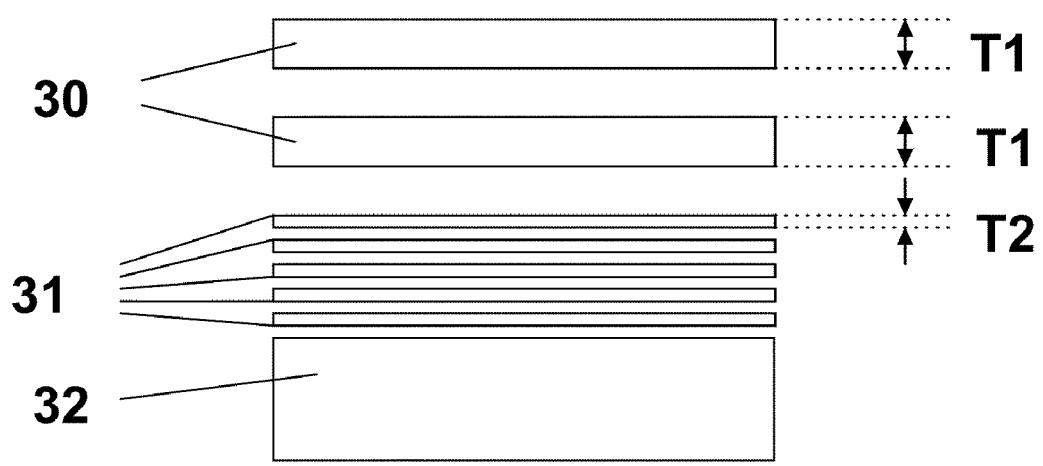
FIG. 5 shows a typical CMOS metal layer stack-up.

In a preferred embodiment, the semiconductor device is implemented in CMOS technology, and the so called "power and/or ground" planes are used as the conductive planes for the coils of the transformer. FIG. 5 shows a typical modern digital CMOS layer stack, comprising a substrate layer 32, for example silicon, above which are five metal layers 31 of for example T2=0.30 μm thickness, electrically isolated from the substrate and from each other by a dielectric layer, on top of which are two additional metal layers 30 of, for example, T1=0.9 μm thickness, again separated by a dielectric layer. These layers 30 are typically used as GND and VDD planes in digital circuits, and are therefore usually called "power and ground" planes even when they are used for a different purpose, as just explained. In RF ICs having an embedded transformer according to the present invention, the transformer structure is best located in these thicker metal layers 30. Due to the higher thickness, tracks of a given width will have less resistance in these layers 30, thus providing a better quality factor of the coils, and less resistive losses. In other words, a transformer implemented in these thicker planes will have better electrical characteristics than a transformer of the same geometry implemented in the other metal layers 31.

The same is true for other semiconductor technologies where metal layers of different thicknesses are used, as e.g. in thin film technology, where it is also advantageous to embed the transformer in the thicker metal planes.

EXAMPLE

Figure 3A:
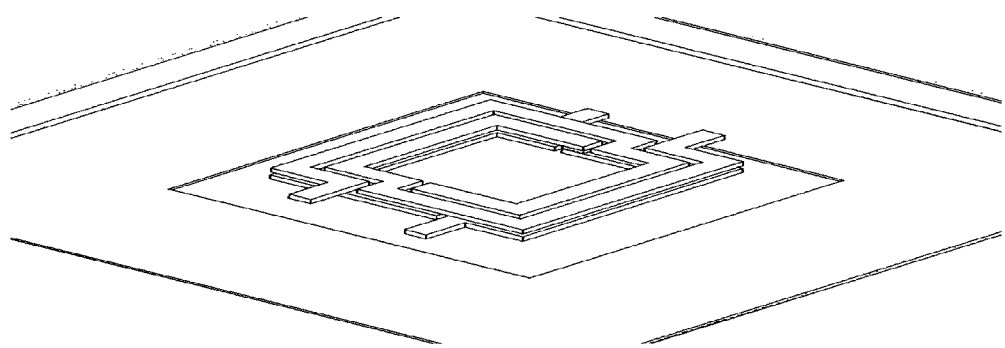
FIG. 3A shows a simulation structure for a transformer having two coils of two windings according to the present invention.

FIG. 3A shows a structure according to the invention having two coils of two windings each, in a practical 60 GHz RF chip application in CMOS technology, having the following dimensions:
dimension of the outer square: 25 μm×25 μm,
dimension of the inner square: 15 μm×15 μm,
conductor width: 2 μm,
conductor spacing: 1 μm,
metal layer thicknesses T1 (FIG. 5): 0.9 μm,
metal layers spacing: 0.6 μm.

However, the person skilled in the art can vary these parameters to any dimension allowed by the technology used, which can be smaller or larger than the numbers used in the simulation. For millimeter wave applications, the dimensions of the outer square could be for example 50 μm×50 μm. When the structure is implemented in a PCB layout, the distance between the metal layers could be e.g. 100 μm.

Figure 3B:
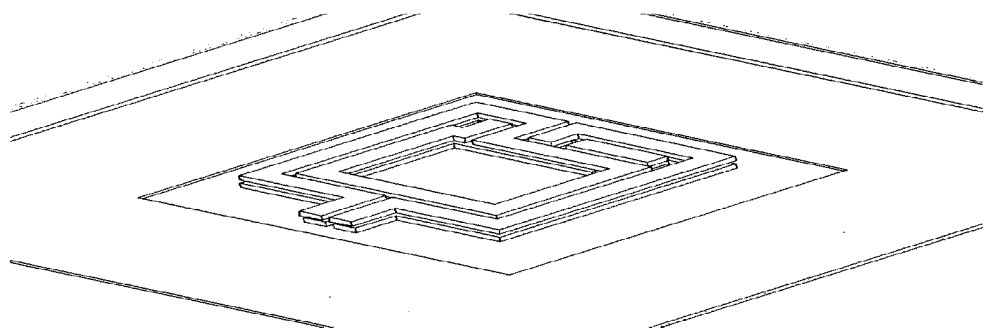
FIG. 3B shows a simulation structure for a transformer having two coils of two windings according to a prior art structure.

The electrical performance of the structure of FIG. 3A has been simulated, and the results are compared with a simulation of the performance of a prior art structure of comparable size, having also two coils with two windings each. FIG. 3B shows a simulation structure of a prior art structure according to FIG. 7 of EP 0 902 443. All parameters are chosen equal to the structure of FIG. 3A, except that the inner area is rectangular and slightly smaller, 15 μm×12 μm, due to the different structure requiring a different topology. The simulation results are shown in FIGS. 4A-4H.

The parameters of the baluns were estimated according to application note and rules of a major balun manufacturer (AN20-001 from Mini-Circuits—which is hereby incorporated by reference.

The parameter extraction (inductance, coupling) has been done according with the publication (Vaesen, K.; Carchon, G.; de Raedt, W.; Beyne, E., "Area Optimized Thin Film Coupled Inductor Band Pass Filters with Integrated Baluns," *Electronics Packaging Technology Conference*, 2008. EPTC 2008. 10*th*, vol., no., pp. 260-264, 9-12 Dec. 2008, which is hereby incorporated by reference.

The electromagnetic simulations were done in an industry-standard software: Momentum of Agilent (version 2008u2). The dimensions, line widths, line spacings, metal thicknesses, material parameters were identical in both cases. Dielectric layer epsilon=4.2 in metal layers number 6-7, (reference 30 in FIG. 5), epsilon=2.5 for metal layers number 1-5 (reference 31 in FIG. 5).

The electric simulations were performed using industry-standard software: ADS of Agilent (version 2008u2) The transformer parameters (inductance, coupling, insertion loss) were derived by simulating a fully differential transformer with disconnected (floating) center taps. The connection of the center taps to ground does not change the simulation results. The balance parameters (amplitude and phase) were extracted in a balun configuration with one input terminal connected to ground and a center tap also connected to ground. The simulation results are shown in FIG. 4A-4H.

Figure 4A:
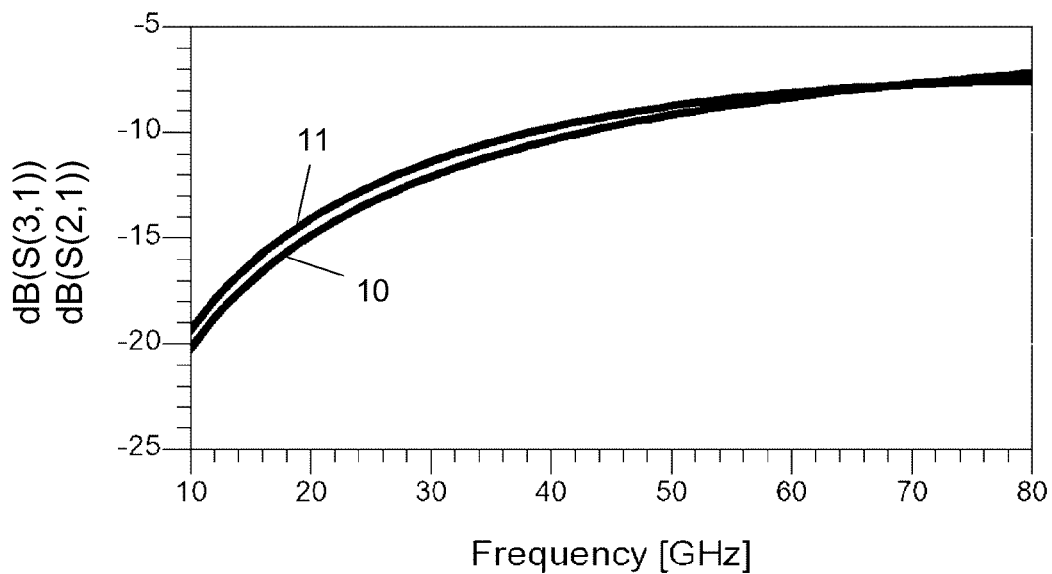
FIGS. 4A, 4B show the S-parameter curves for the transformer structure of FIG. 3A in balun configuration.
Figure 4B:
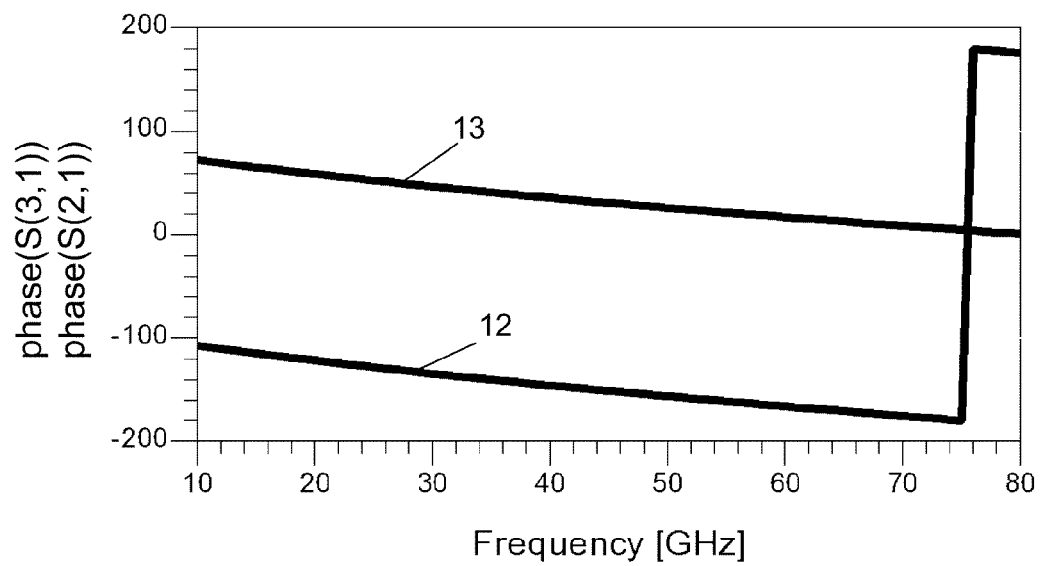

FIGS. 4A and 4B show the S-parameter curves of the structure of FIG. 3A, in balun configuration, wherein curve 10 shows dB(S(3,1)), curve 11 shows dB(S(2,1)), curve 12 shows phase(S(3,1)), curve 13 shows phase(S(2,1)). As shown in the graphs, the amplitude curve for the positive signal and the negative signal are almost identical, and the phase curves are very close to 180 degrees shifted, which demonstrates the electrical symmetry of the structure.

If FIGS. 4C-4H, the full line is the curve for the structure of the present invention according to FIG. 3A, and the dotted line is the curve for the prior art structure according to FIG. 3B. The simulation results show that the performance of the structure according to the invention is at least as good as the performance of the prior art structure, while adding the advantage that the terminals are located on opposite sides of the structure.

Figure 4C:
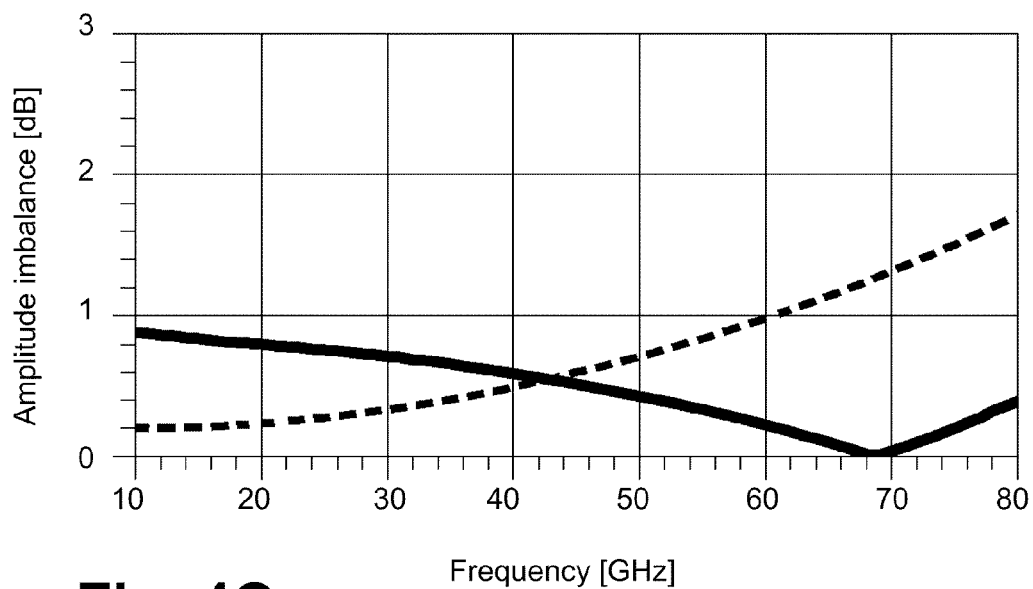
FIGS. 4C-4H show RF and electrical simulation results for the structures of FIGS. 3A and 3B.
Figure 4D:
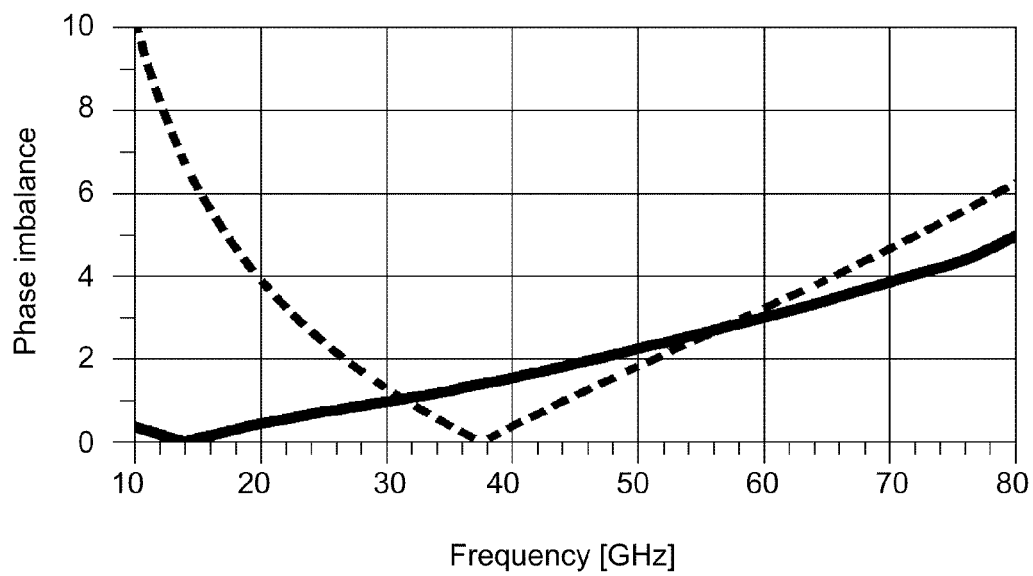
Figure 4E:
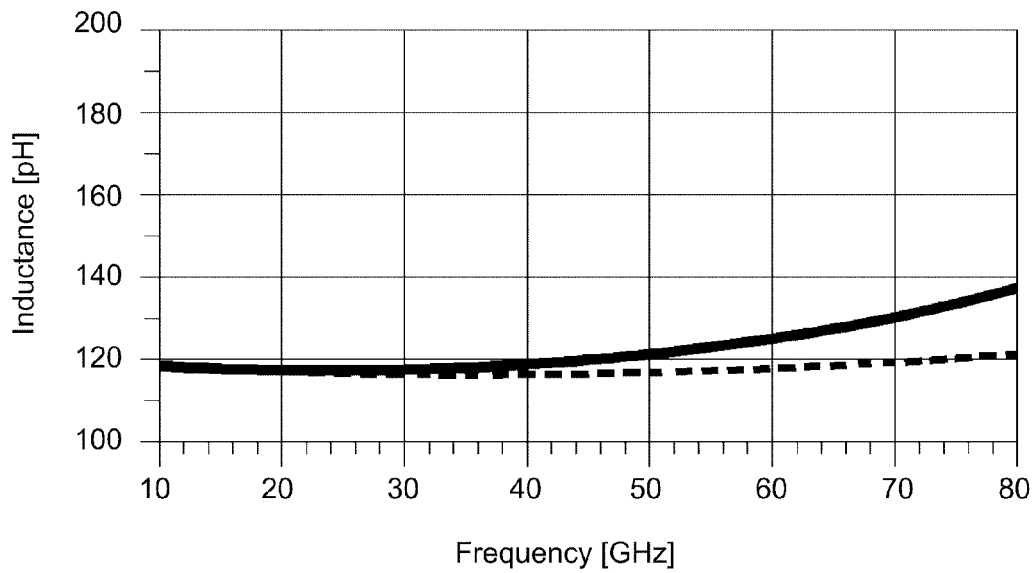
Figure 4F:
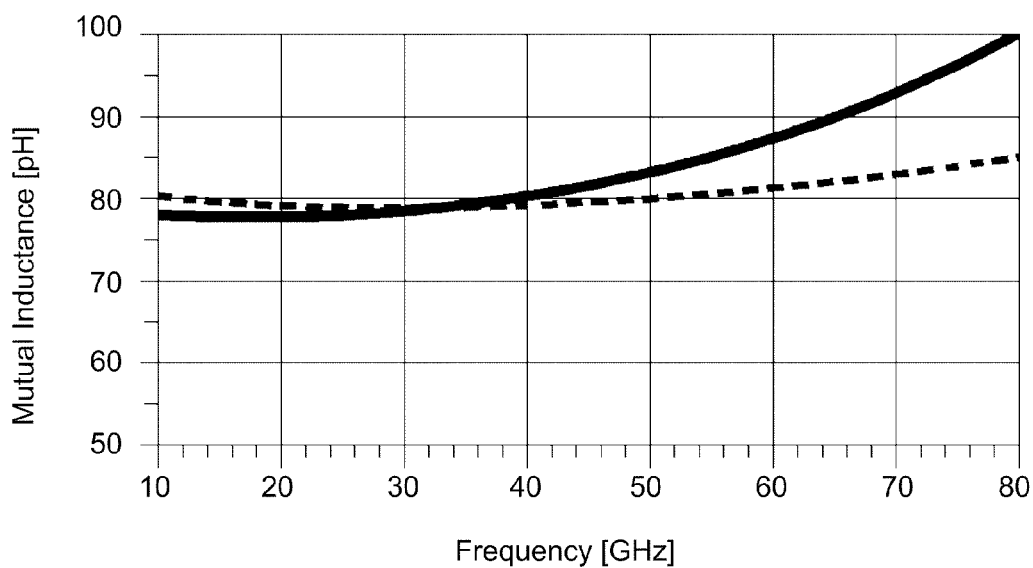
Figure 4G:
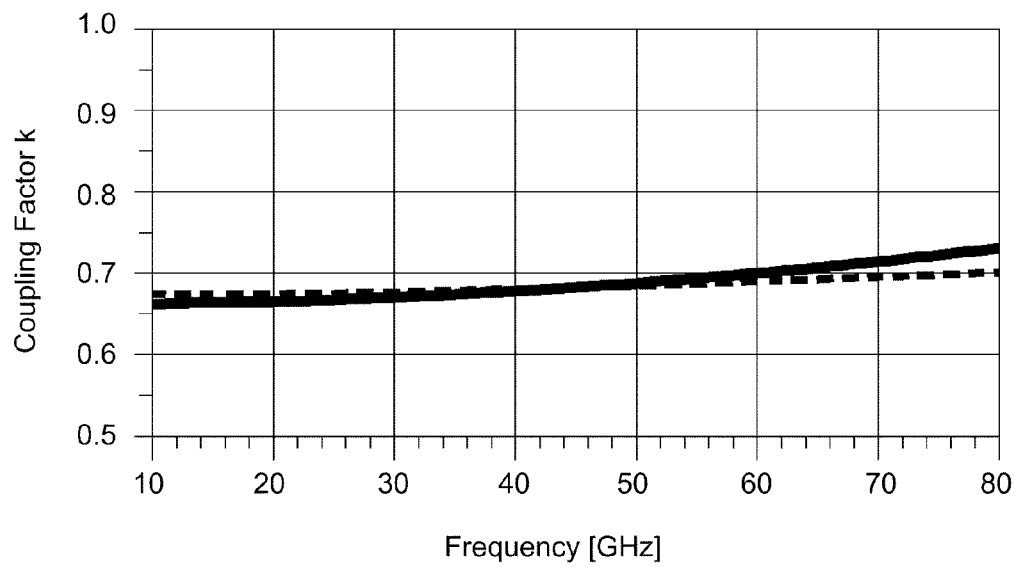
Figure 4H:
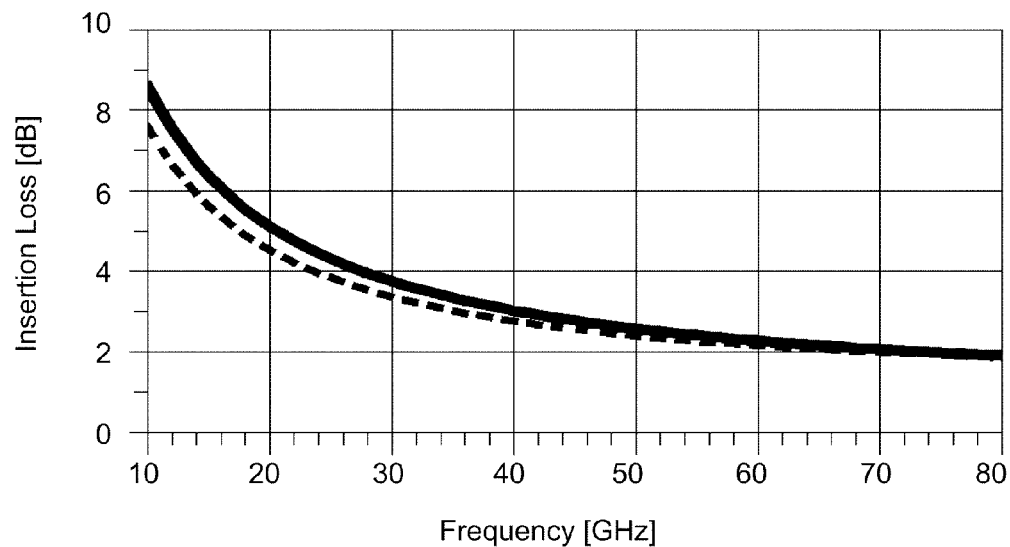

FIGS. 4C and 4D show a very low amplitude and phase imbalance, as could be expected for a perfect geometrical structure. The small imbalance is not due to the structure itself, but due to parasitic effects caused by parasitic coupling with the environment of the structure, such as the substrate and the metal layers. A comparison of the curves of the curves in FIG. 4C shows that, at 60 Hz the amplitude imbalance of the structure of the present invention is much lower than that of the prior art structure, which is preferred. FIG. 4E shows that the inductance of the coils of the structure of the present invention at 60 GHz is higher than the inductance of the prior art structure, meaning that the dimensions of the structure of the invention could have been slightly smaller than the prior art structure for a given inductance value, thus space could have been saved by using the structure of the invention.

The invention claimed is:

1. A symmetrical transformer with a stacked coil structure comprising a primary and a secondary coil each having at least two turns, the primary and secondary coils being located in a first and a second conductive plane which are electrically isolated from each other by an intermediate dielectric layer, the primary and secondary coils being electrically isolated from each other and being arranged so that magnetic coupling takes place between them, wherein the structure comprises four identical basic elements, each basic element providing a conductive path for part of said coils the first conductive plane comprising a first of said basic elements and a second of said basic elements electrically isolated from each other, the first basic element providing half of the turns and a first terminal of the primary coil, the second basic element providing half of the turns and a second terminal of the secondary coil, the first terminal of the primary coil and the second terminal of the secondary coil being located on opposite sides of the structure, the second conductive plane comprising a third of said basic elements and a fourth of said basic elements electrically isolated from each other, the third basic element providing half of the turns and a third terminal of the secondary coil, the fourth basic element providing half of the turns and a fourth terminal of the primary coil, the fourth terminal of the primary coil and the third terminal of the secondary coil being located on opposite sides of the structure, the first and fourth terminal of said primary coil being located on the same side of the structure and in different planes from one another, the second and third terminal of said secondary coil being located on the same side of the structure and in different planes from one another, an end of the first basic element being electrically connected to an end of the fourth basic element by a first connection through the dielectric layer, an end of the second basic element being electrically connected to an end of the third basic element by a second connection through the dielectric layer.

2. The symmetrical transformer according to claim 1, wherein the structure is symmetrical around an imaginary axis (Z) passing through the center of the structure (C) and perpendicular to the conducting planes.

3. The symmetrical transformer according to claim 1, wherein the structure is symmetrical around an imaginary axis (X) lying in the dielectric layer, passing through the center (C) of the structure and passing through the first and second connections.

4. The symmetrical transformer according to claim 1, wherein the structure is symmetrical around an imaginary axis (Y) lying in the dielectric layer, passing through the center of the structure and passing in the middle between the first and second connections.

5. The symmetrical transformer according to claim 1, wherein the primary coil includes a first center-tap, located at the first connection which enables the terminals of the primary coil to be used as a differential port.

6. The symmetrical transformer according to claim 5, wherein the secondary coil includes a second center-tap, located at the second connection which enables the terminals of the secondary coil to be used as a differential port.

7. A semiconductor device comprising a symmetrical transformer integrated on a chip, the symmetrical transformer having a stacked coil structure comprising a primary and a secondary coil each having at least two turns, the primary and secondary coils being located in a first and a second conductive plane which are electrically isolated from each other by an intermediate dielectric layer, the primary and secondary coils being electrically isolated from each other and being arranged so that magnetic coupling takes place between them, wherein the structure comprises four identical basic elements, each basic element providing a conductive path for part of said coils the first conductive plane comprising a first of said basic elements and a second of said basic elements electrically isolated from each other, the first basic element providing half of the turns and a first terminal of the primary coil, the second basic element providing half of the turns and a second terminal of the secondary coil, the first terminal of the primary coil and the second terminal of the secondary coil being located on opposite sides of the structure, the second conductive plane comprising a third of said basic elements and a fourth of said basic elements electrically isolated from each other, the third basic element providing half of the turns and a third terminal of the secondary coil, the fourth basic element providing half of the turns and a fourth terminal of the primary coil, the fourth terminal of the primary coil and the third terminal of the secondary coil being located on opposite sides of the structure, the first and fourth terminal of said primary coil being located on the same side of the structure and in different planes from one another, the second and third terminal of said secondary coil being located on the same side of the structure and in different planes from one another, an end of the first basic element being electrically connected to an end of the fourth basic element by a first connection through the dielectric layer, an end of the second basic element being electrically connected to an end of the third basic element by a second connection through the dielectric layer, wherein the conductive planes are metal planes.

8. The semiconductor device according to claim 7, wherein the device is implemented in CMOS technology, and the metal planes are power and/or ground planes of a CMOS substrate.

9. The semiconductor device according to claim 7 wherein the device is implemented in thin film technology, and the metal planes are power and/or ground planes of a thin film substrate.

* * * * *